United States Patent
Joshi et al.

(10) Patent No.: US 9,471,732 B2
(45) Date of Patent: *Oct. 18, 2016

(54) EQUIVALENT DEVICE STATISTICAL MODELING FOR BITLINE LEAKAGE MODELING

(75) Inventors: Rajiv V. Joshi, Yorktown Heights, NY (US); Rouwaida N. Kanj, Round Rock, TX (US); Sani R. Nassif, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 819 days.

This patent is subject to a terminal disclaimer.

(21) Appl. No.: 13/616,991

(22) Filed: Sep. 14, 2012

(65) Prior Publication Data

US 2013/0014069 A1    Jan. 10, 2013

Related U.S. Application Data

(63) Continuation of application No. 12/551,777, filed on Sep. 1, 2009, now Pat. No. 8,346,528.

(51) Int. Cl.
  *G06F 17/50* (2006.01)
(52) U.S. Cl.
  CPC .................................. *G06F 17/5036* (2013.01)
(58) Field of Classification Search
  USPC ....................... 703/14–22; 716/108, 136, 113
  See application file for complete search history.

(56) References Cited

U.S. PATENT DOCUMENTS

| 7,380,225 | B2 | 5/2008 | Joshi et al. |
| 7,885,798 | B2 * | 2/2011 | Joshi et al. ................ 703/13 |
| 2005/0127948 | A1 | 6/2005 | Kim et al. |
| 2009/0080275 | A1 | 3/2009 | Vo |
| 2009/0164194 | A1 * | 6/2009 | Shrivastava et al. ........ 703/14 |
| 2009/0306953 | A1 * | 12/2009 | Liu et al. .................. 703/14 |
| 2011/0054856 | A1 | 3/2011 | Joshi et al. |

OTHER PUBLICATIONS

Jie Gu, Sachin S. Saoatnekar, Chris Kim Width-dependent Statistical Leakage Modeling for Random Dopant Induced Threshold Voltage Shift DAC Jun. 4-8, 2007.*

(Continued)

*Primary Examiner* — Omar Fernandez Rivas
*Assistant Examiner* — Cuong Luu
(74) *Attorney, Agent, or Firm* — Thompson Hine LLP

(57) ABSTRACT

Mechanisms are provided for modeling a plurality of devices of an integrated circuit design as a single statistically equivalent wide device. An integrated circuit design is analyzed to identify a portion of the integrated circuit design having the plurality of devices. For the plurality of devices, a statistical model of a single statistically equivalent wide device is generated which has a statistical distribution of at least one operating characteristic of the single statistically equivalent wide device that captures statistical operating characteristic distributions of individual devices in the plurality of devices. At least one statistical operating characteristic of the single statistically equivalent wide device is a complex non-linear function of the statistical operating characteristics of the individual devices. The integrated circuit design is modeled using the single statistically equivalent wide device.

25 Claims, 5 Drawing Sheets

(56) References Cited

OTHER PUBLICATIONS

Saibal Mukhopadhyay, Hamid Mahmoodi, Kaushik Roy Modeling of Failure Probability and Statiscal Design of SRAM Array for Yield Enhancement in Nanoscaled CMOS IEEE Transactions on Computer-Aided Design of Integrated Circuits and Systems, vol. 24, No. 12, Dec. 2005.*
U.S. Appl. No. 12/551,777.
Beaulieu, Norman C. et al., "Estimating the Distribution of a Sum of Independent Lognormal Random Variables", IEEE Transactions on Communications, vol. 43, No. 12, Dec. 1995, pp. 2869-2873.
Dilillo, Luigi et al., "Leakage Read Fault in Nanoscale SRAM: Analysis, Test and Diagnosis", International Design and Test Workshop, Nov. 19-20, 2006, 7 pages.
Gu, Jie et al., "Width-dependent Statistical Leakage Modeling for Random Dopant Induced Threshold Voltage Shift", ACM, Design Automation Conference (DAC) 2007, Jun. 4-8, 2007, pp. 87-92.

* cited by examiner

FIG. 4

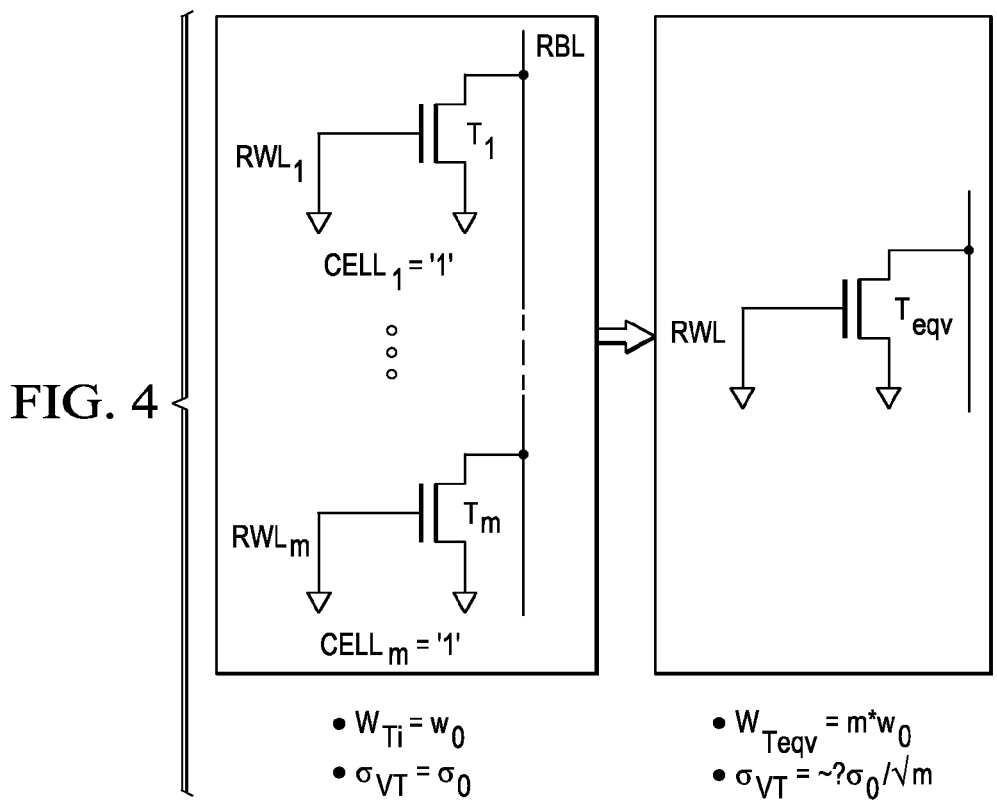

- $W_{Ti} = w_0$
- $\sigma_{VT} = \sigma_0$

- $W_{Teqv} = m*w_0$
- $\sigma_{VT} = \sim?\sigma_0/\sqrt{m}$

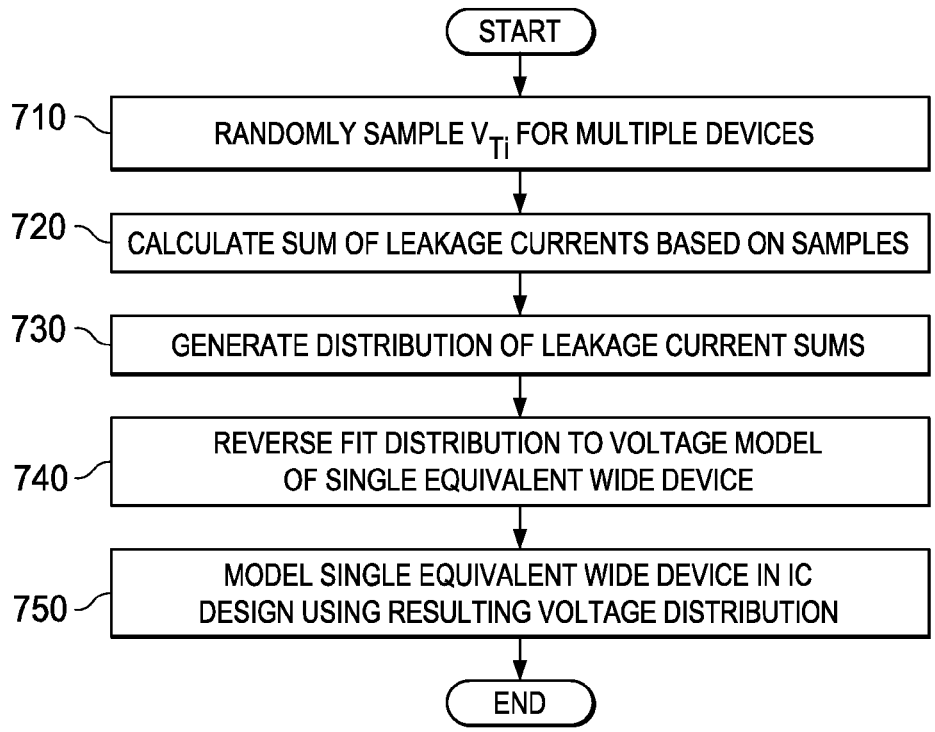

710 — RANDOMLY SAMPLE $V_{Ti}$ FOR MULTIPLE DEVICES

720 — CALCULATE SUM OF LEAKAGE CURRENTS BASED ON SAMPLES

730 — GENERATE DISTRIBUTION OF LEAKAGE CURRENT SUMS

740 — REVERSE FIT DISTRIBUTION TO VOLTAGE MODEL OF SINGLE EQUIVALENT WIDE DEVICE

750 — MODEL SINGLE EQUIVALENT WIDE DEVICE IN IC DESIGN USING RESULTING VOLTAGE DISTRIBUTION

FIG. 7

EQUIVALENT DEVICE STATISTICAL MODELING FOR BITLINE LEAKAGE MODELING

BACKGROUND

The present application relates generally to an improved data processing apparatus and method and more specifically to mechanisms for equivalent device statistical modeling for representing a group of devices by a single equivalent device using a characteristic equivalent distribution for the equivalent device. A specific application of this equivalent device statistical modeling encompasses mechanisms for bitline leakage modeling.

As memory array architectures are pushed to their practical limits by increasing requirements for density and speed, accurately estimating the memory cell failure rate of a design becomes increasingly critical. Since a finite number of redundant rows and/or columns of memory cells are available to replace those containing defective cells, a number of failed memory cells above this level of redundancy will yield a defective device. The number of defective devices or the device yield is then directly related to the memory cell failure rate. Larger memory arrays being fabricated today have increasingly stringent failure rate control requirements. For example, in order to achieve a yield of 90% in a one-million memory cell array without redundancy, a failure rate below 5σ must be held.

Traditional techniques, such as Monte-Carlo analysis, produce accurate results at a cost of a large number of iterations, due to the random sampling of the entire probability space of the independent variables that are treated in the analysis. As the memory cell failure rate decreases, the number of samples and iterations required for accurate analysis becomes increasingly large, because of the relatively sparse distribution of samples in the distribution tail(s) that correspond to failed memory cells. The effect of circuit changes on memory cell read and writeability, as well as minimum read and write cycle times and margins, are difficult to estimate at very low failure rate levels. Thus, such low failure rates cause further complications for adjusting designs to achieve the best result.

Techniques other than Monte-Carlo analysis have been implemented for estimating memory cell failure rates, each with related drawbacks. Sensitivity analysis is a well-known technique in which the gradients of the various independent variables are used to determine the bounds of the non-failure confidence region. However, accurate estimates of the failure rate are not typically produced by sensitivity analysis, as sensitivity analysis by its very nature cannot determine the exact overlapping impact of all independent variables on the memory cell failure rate at once. Another technique that can accurately estimate the failure rate is the grid analysis approach, in which the grid size can be made arbitrarily small. However, the number of simulations increases exponentially with the number of independent variables and typically a large amount of custom coded program control (scripting) must be employed to direct the analysis.

In addition, this analysis of an integrated circuit design, and thus the determination of an expected memory cell failure rate, becomes increasingly more difficult when taking into account dynamic failures, such as bitline leakage failures. As described in Dilillo et al., "Leakage Read Fault in Nanoscale SRAM: Analysis, Test and Diagnosis," International Design and Test Workshop, 19-20 Nov., 2006, most memory testing mechanisms rely on classic fault models such as stuck at fault, coupling fault, and transition fault. However, dynamic faults, such as dynamic faults due to leakage currents, are a more complex class of faults requiring complex testing mechanisms.

In SRAM structures, the leakage currents that flow through the two pass transistors of unselected cells interfere with the read operation of the SRAM. The read operation in SRAM memories relies on the detection of differential voltage levels between the bit lines generated by the selected cells. In the same column where the cell to be read is placed, leakage currents of unselected cells generate another differential effect that may be opposite to the one useful for the read function. The consequent "mask effect" is generally considered the cause of performance reduction in SRAM structures, especially in terms of operating frequency reduction. These leakage currents may further induce the sense amplifier of the SRAM structure to be unable to detect properly the correct value for the memory output with the occurrence of leakage read faults.

The modeling of such bitline leakages for purposes of analysis and determining of failure rates is very complex, involving large sets of independent variables. For example, if there is an array of 100 devices, each having voltage fluctuations, this translates to an analysis problem dealing with at least 100 independent voltage fluctuation variables. This may lead to a 100D dimensional space that needs to be sampled to accurately model and analyze the impact of bitline leakages on the failure rate of a SRAM structure. It is much easier to model a smaller dimensional space, e.g., a 3D space, and sample it based on a 3D model as opposed to modeling a 100D dimensional space and sampling it. This is true for different methodologies including grid based methods, methods that rely on response surface modeling, and any other methods that employ uniform analysis for pre-screening phase (like mixture importance sampling method) to find important failure regions.

SUMMARY

In one illustrative embodiment, a method, in a data processing system, is provided for modeling a plurality of devices of an integrated circuit design as a single statistically equivalent wide device. The method comprises storing an integrated circuit design in a storage device associated with the data processing system. The method further comprises analyzing, by a processor of the data processing system, the integrated circuit design to identify a portion of the integrated circuit design having the plurality of devices. Moreover, the method comprises generating, by the processor, for the plurality of devices, a statistical model of a single statistically equivalent wide device having a statistical distribution of at least one operating characteristic of the single statistically equivalent wide device that captures statistical operating characteristic distributions of individual devices in the plurality of devices. At least one statistical operating characteristic of the single statistically equivalent wide device is a complex non-linear function of the statistical operating characteristics of the individual devices. In addition, the method comprises modeling, by the data processing system, the integrated circuit design using the single statistically equivalent wide device.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 4 is an example diagram illustrating one way in which the read ports of a plurality of memory cells in a memory cell array may be modeled as an equivalent single wide device in accordance with one illustrative embodiment;

FIG. 7 is a flowchart outlining an example operation of a circuit model transformation by replacing large numbers of similar devices with a single equivalent wide device, such as may be performed by the circuit model transformation engine 640 in FIG. 6, for example, in accordance with one illustrative embodiment.

DETAILED DESCRIPTION

Figure 1:
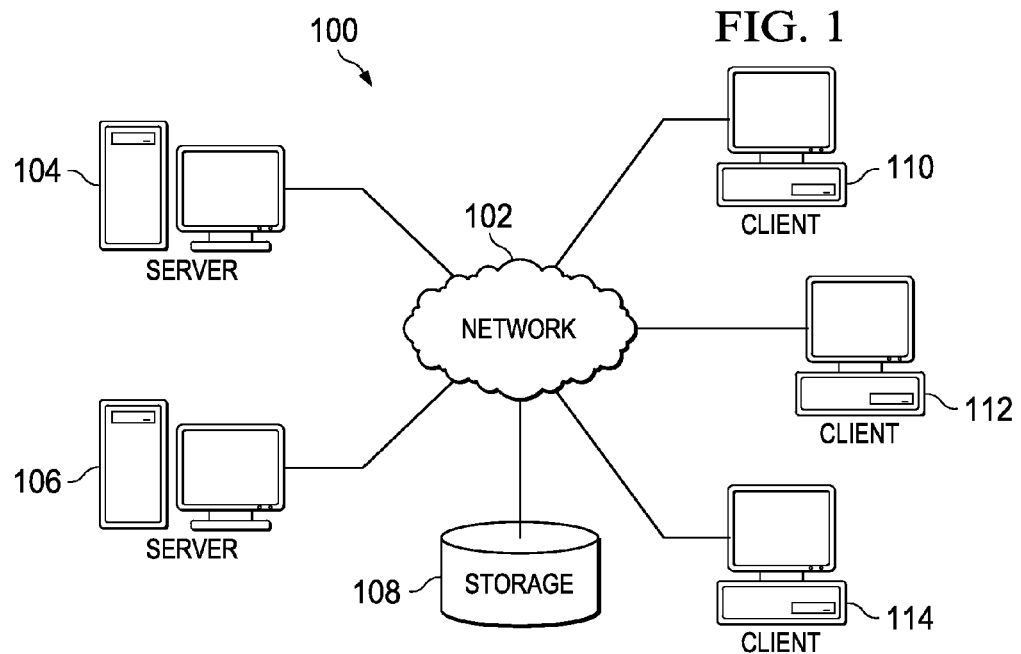
FIG. 1 is an example pictorial representation of an example distributed data processing system in which aspects of the illustrative embodiments may be implemented.

The illustrative embodiments provide a mechanism for statistically determining a model of a single equivalent device for a large array of devices and a proper sampling distribution to accurately model the large array of devices as a single equivalent device to thereby replace the large array of devices with this one single equivalent device for purposes of failure analysis. In one illustrative embodiment, an array of memory cells of an SRAM structure may be replaced by a single equivalent device that is statistically determined and may then be used for purposes of determining a failure rate of the SRAM structure. In essence, in the presence of process variation the illustrative embodiments allow a large array of devices, which may be modeled using a large number of independent variables, to be replaced by a single device with an equivalent single independent variable distribution. Thus, rather than having to measure the yield of a metric that is a non-linear function of a large number of independent variables, the yield of this metric may be measured according to this single independent variable distribution.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In addition, the program code may be embodied on a computer readable storage medium on the server or the remote computer and downloaded over a network to a computer readable storage medium of the remote computer or the users' computer for storage and/or execution. Moreover, any of the computing systems or data processing systems may store the program code in a computer readable storage medium after having downloaded the program code over a network from a remote computing system or data processing system.

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented.

Figure 2:
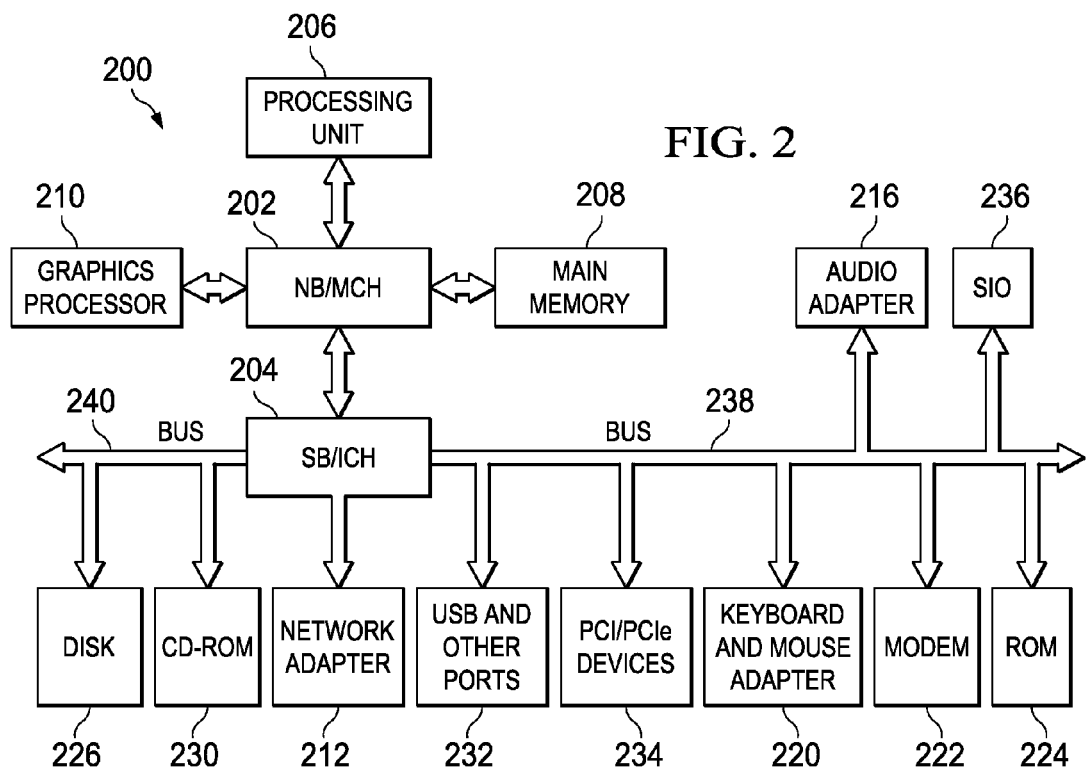
FIG. 2 is an example block diagram of an example data processing system is shown in which aspects of the illustrative embodiments may be implemented.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

In accordance with the mechanisms of the illustrative embodiments, the data processing systems and devices shown in FIGS. 1 and 2 may be used to model an integrated circuit device for purposes of testing and analysis prior to fabrication of the integrated circuit device. As part of the testing and analysis, the integrated circuit device and elements of the integrated circuit device may be modeled in an integrated circuit device design that is tested and analyzed with regard to many different factors including timing requirements, electrical operation requirements, and the like, to detect failures and areas of the integrated circuit design where the modeled operation of the integrated circuit deviates from expected or required operation. As part of this modeling, testing, and analysis, the mechanisms of the illustrative embodiments may be used to model nonlinear behaviors (e.g., leakage currents) in large numbers of common devices, such as may be present in an array or the like.

With the mechanisms of the illustrative embodiments, the objective is to enable statistical analysis tools to capture the nonlinear behavior effects while avoiding the high dimensional complexity in terms of contribution from the large number of devices to the nonlinear behavior. Hence a nonlinear model, in this application a leakage model, is generated that reduces the complexity of modeling and analyzing characteristics, e.g., leakage characteristics, of a large number of devices by representing the large number of devices as a single equivalent device using a statistical modeling approach. The random variables of the large number of devices $(1, \ldots, N)$ are randomly sampled and the nonlinear model behavior is calculated for each sample $\{x_1, \ldots, x_N\}$. A distribution of the nonlinear behavior (Y) of the multiple devices is gathered, such as by using a cumulative distribution function Cdf $(Y_1, \ldots, Y_N)$, probability density function Pdf ( ), or a histogram. On the other hand, a model for the equivalent device may be obtained in terms of its nonlinear behavior $Y_w$, and single random variable $x_w$: $x_w = g$ ($Y_w$); or $Y_w=f(x_w)$, where $f=g^{-1}$. From a distribution Cdf/Pdf($Y_{1, \ldots, N}$), and g(.), Cdf($x_w$) may be obtained by a reverse fitting operation and hence, a desired distribution for an equivalent device may be obtained that enables the same statistical behavior outcome of the design using the single equivalent device as opposed to a large set of individual devices.

With the mechanisms of the illustrative embodiments, the above technique may be specifically applied to modeling leakage currents in the yield analysis of memory designs, wide-OR designs, mux structures, etc. It should be appreciated, however, that while the illustrative embodiments will be described in terms of applying the mechanisms of the illustrative embodiments specifically to modeling leakage currents, the illustrative embodiments are not limited to such. Rather, the mechanisms of the illustrative embodiments may be applied to modeling any plurality of devices as a single equivalent device where the equivalent behavior/drive, e.g., current, is a non-linear function of the random variables of the individual devices; i.e., a complex combination of the random variables where in many cases an exact closed form relation would not exist (as opposed to linear summation of Gaussian variables for examples). For example, other applications of the mechanisms of the illustrative embodiments may include modeling the subthreshold currents of integrated circuit devices, e.g., transistors, logic elements such as OR gates, AND gates, NOR gates, and other logic devices, and the like. For example, in some integrated circuit designs, the circuit devices may be designed to operate near an on/off current level and thus, the mechanisms may be used to model a large set of circuit devices as a single equivalent wide device with regard to threshold current rather than bitline leakage current. Other modeling using an equivalent single wide device may be performed with regard to resistance/capacitance of the individual devices (active or passive elements) so as to provide a single equivalent wide device having a corresponding resistance/capacitance distribution. For example in sub-nm technologies, the gate-capacitance of device can vary. The current is inversely proportional to it and so the complex relation for the equivalent wide device whose drive is the sum of the currents. Another example, would be modeling distribution of dielectric depth (different layers) variations in terms of resistance or capacitance for parallel devices. In short, the illustrative embodiments may be used to model any plurality of devices by a single equivalent wide device where the equivalent characteristic of the single equivalent wide device being modeled is a complex/non-linear function of random variables of the individual devices.

In one illustrative embodiment, a single wide device model is used to approximate the statistical distribution of a series of devices by modeling the voltage distribution. With regard to current leakage, for example, the goal is to emulate total leakage of N devices with one equivalent device by randomly sampling the threshold voltages of the N devices and obtaining a total leakage distribution by summing the sampling of leakages of the individual devices. This leakage distribution is then mapped to an effective threshold voltage distribution of the equivalent device by a pre-characterized voltage versus leakage curve of the equivalent device. With regard to bitline leakage, the bitline leakage current due to all the non-accessed cells on a bitline can be emulated by a single device with a calculated threshold voltage distribution. Ultimately, the illustrative embodiments reduce the number of sampled random variables during modeling of a circuit by removing the large number of similar devices and replacing them with one equivalent wide device. In this way, the modeling achieves a faster and better convergence.

With regard to one illustrative embodiment, in which bitline leakage is modeled using the techniques and mechanisms described herein, the threshold voltages of the large number of devices are randomly sampled and a leakage current summation is calculated for each of the samples. A distribution of the leakage current summations, is obtained from sampling the behavior of the multiple devices. The samples in the distribution of the leakage current summations then determine the equivalent current of the equivalent single device and thus reverse fit into a threshold voltage distribution model of an equivalent single device for the multiple devices to generate a plurality of equivalent threshold voltage values for the equivalent single device. A distribution of the threshold voltage summation values for the equivalent single device is then used to model the multiple devices as a single equivalent device in a statistical integrated circuit model of an integrated circuit device. In this example, the multiple devices are assumed to be subject to the same biasing (e.g., gate-to-source voltage) as the equivalent device.

The mechanisms of the illustrative embodiments may be used to model any large number of similar devices that exhibit similar behavior and have similar operating conditions in order to determine an equivalent single device model for purposes of modeling leakage current effects or similar other nonlinear behaviors where the equivalent device distribution is not a simple linear combination of the multiple device distributions due to non-linearity of the phenomena under study as a function of process variations. Thus, while the illustrative embodiments will be described with regard to leakage current modeling of memory cells in a memory cell array, such as may be found in a register file, SRAM, or the like, it should be appreciated that the mechanisms of the illustrative embodiments may be applied to modeling of other arrays or large numbers of devices in which leakage current is an issue. For example, the mechanisms of the illustrative embodiments may be used to model leakage currents associated with wide OR designs, multiplexer structures, and the like. Moreover, the mechanisms of the illustrative embodiments may also be used in modeling sub-threshold currents in ultra low voltage regimes. Also, the mechanisms of the illustrative embodiments can be used to model statistical noise analysis of wide dynamic OR cells, in the presence of similar input glitches on multiple OR devices. Moreover, the mechanisms of the illustrative embodiments may be used to model a non-linear resistor (a plurality of active element effects) on a voltage divider circuit subject to process variations.

Figure 3:
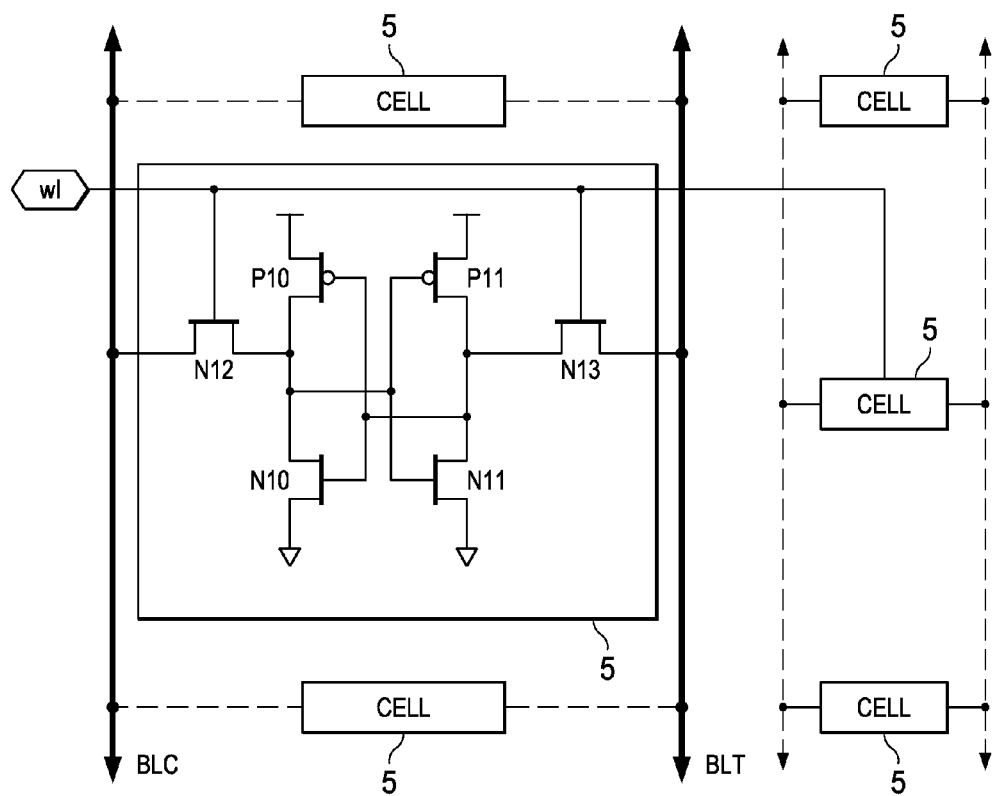
FIG. 3 is an example diagram of memory cells that can be modeled by a method in accordance with one illustrative embodiment.

With reference now to the figures, and in particular with reference to FIG. 3, an example diagram of memory cells that can be modeled by mechanisms of the illustrative embodiments is shown in an array that includes a plurality of memory cells 5, hereafter referred to simply as "cells." Transistors P10, N10, P11 and N11 form a cross-coupled static latch that provides the storage of a value in the cell 5. Transistors N12 and N13 provide access to the value stored in the cell in response to a word line select signal (WL). Bit lines BLT (true bit line) and BLC (complement bit line) couple all cells in a column, so that when a row is selected by signal WL, only one row cell from each column is exposed to the memory logic.

For a write operation, bit lines BLC and BLT are charged to voltages corresponding to the desired state of the memory cell and WL is activated (pulsed), setting the state of the latch formed by transistors P10, N10, P11 and N11. For a read operation, the bit lines BLC and BLT are previously charged to opposite state predetermined voltages (generally $V_{dd}$ and ground), and to commence the read, WL is pulsed and a sense amplifier coupled to bit lines BLC and BLT determines the stored state by differential comparison of bit lines BLC and BLT.

Depending on the relative strengths of the transistors P10-11 and N10-13, the cell will exhibit varying ability to perform to predetermined read/write cycle times and may be unstable in that the cell value does not remain constant after a write or when being read. The relative strengths of the transistors P10-11 and N10-13 may vary across similar cells due to process variations, i.e. variations in the process of fabricating or forming the transistors P10-11 and N10-13. As operating frequencies are increased and device sizes correspondingly decreased, the variations take on a statistically significantly greater range causing failure of an increasing number of devices in an integrated circuit chip. The illustrative embodiments are directed toward an efficient mechanism for statistically analyzing the design of devices, such as memory cells 5, so that the yield of the devices, e.g., memory cells 5, can be predicted accurately and further so that yields may be improved by selecting optimized nominal values for the device parameters and other environmental parameters such as operating voltages. The illustrative embodiments achieve such results by providing mechanisms to accurately model a plurality of similar devices, such as the leaky pass-gates of the array of memory cells 5 sharing the same column as an active memory cell during a read as shown in FIG. 3, as a single wide device, e.g., memory cell, that uses a statistical distribution that enables an equivalent behavior (e.g., leakage current) to that of the plurality of devices. The model of the single equivalent wide device thereby reduces the complexity of modeling, testing, and analyzing an integrated circuit design while providing accurate operational modeling consistent with a situation in which each individual device in the plurality of similar devices is modeled individually.

While the illustrated cells 5 are an example of cells of order 4 that may be analyzed and improved by the mechanisms according to the illustrative embodiments, it should be understood that the techniques illustrated herein may be applied to memory cells of any order and design and to circuits other than memory circuits, as well. "Order," as the term is used herein, refers to the number of devices that implement the storage element of the cell exclusive of the bit line access transistors. It should be appreciated that it is also possible to have different types of access transistors, read ports, and write ports, and normally those ports are the main reason for issues like leakage to bitline.

FIG. 4 is an example diagram illustrating one way in which a plurality of memory cell devices, such as memory cells 5 in FIG. 3, in a memory cell array may be modeled as an equivalent single wide device. As shown in FIG. 4, the memory cell array 400 includes a plurality of memory cells 410-420 coupled to a read bit line (RBL) 430. The memory cells 410-420 has associated transistors T1 to Tm that couple to the RBL 430. These transistors T1 to Tm may be similar to transistors N13 in FIG. 3 coupled to true bit line (BLT) which may be equivalent to read bit line (RBL) 430, or may be part of a read port in an 8T SRAM cell or register file.

One way to model the plurality of memory cells 410-420 is to assume that each memory cell is exactly the same and operates in exactly the same way (e.g., in case of capturing bitline leakage effects, all inactive cells can be assumed to be storing 0 near N13, the N13 gate is off, and leakages through N13 discharge the bitline erroneously). Each memory cell on the shared bitline has N13 transistors of a fixed physical width and a same standard deviation of their input voltage:

$$W_{Ti} = w_0$$

$$\sigma_{VT} = \sigma_0$$

$$\mu_{VT} = \mu_0$$

where WTi is the width of transistor Ti, w0 is a fixed width of the transistor, $\sigma_{VT}$ is the standard deviation of the input voltage of the transistor, and $\sigma_0$ is the common standard deviation of the input voltage of each of the transistors. During statistical analysis however, these transistors can assume different random values of the threshold voltage variations.

Using this assumption, one can model the plurality of memory cells 410-420 as a single equivalent wide memory cell 440 in which the width of the transistor 445 is increased to represent the combination of widths of the plurality of memory cells 410-420. As is generally known in the art, the current of a transistor increases in proportion to an increase in width.

Thus, the single equivalent wide memory cell 440 has the following width 410:

$$W_{Teqv} = m * w_0$$

However the typical standard deviations of the threshold voltage of the wide device 420, along with '0' mean for the threshold voltage variations is not a good representative of the statistical behavior of the plurality of the devices.

$$\sigma_{VT} = \sigma_0 / \text{sqrt}(m)$$

where m is the number of memory cells 410-420 and $W_{Teqv}$ is the width of the equivalent transistor. The objective of the mechanisms of the illustrative embodiments is to provide an alternate empirical equivalent distribution that would enable the wide device to be a good statistical representative of the plurality of the wide devices. It should be noted that, in alternate applications, it is possible that the plurality of the devices are subject to different conditions, or are not very similar, but it is possible to search for the approximate conditioning of the wide device (in this case it would be the sum of all widths) and equivalent threshold voltage distribution using the methodology described herein.

The leakage current for the single equivalent wide memory cell 440 may be calculated as the sum of the leakage currents for the individual memory cells 410-420 as follows:

$$I\text{leak\_wide\_device} = m*w*C*e^{-\Delta Vt\text{-}eqv} = \Sigma(I\text{leak of small devices}) = w*c*\Sigma e^{-\Delta Vti}$$

where again, m is the number of individual memory cells 410-420, w is a width of the individual memory cells 410-420, e.g., w0, C is a constant for the single equivalent wide memory cell 440 based on empirical or physical models (e.g., bsim models for spice-like simulators), $\Delta Vt\text{-}eqv$ is the equivalent threshold voltage variation on the wide device required to match the wide device leakage current to that of the individual devices whose threshold voltage variations are represented by $\Delta Vti \sim N(\mu_0, \sigma_0)$, $e^{-\Delta Vt\text{-}equ}$ is the variable portion of the leakage current of the single equivalent wide memory cell 440, c is a constant coefficient for the individual memory cells 410-420 access device leakage currents (and may be equal to C in some cases) and can be determined empirically, for a given random sample, $\Delta Vti$ is the random threshold voltage assignment of device 'i' of the plurality of the devices under study, and the sum of the leakage currents of the individual memory cell access transistors 410-420 is proportional to $\Sigma e^{-\Delta Vti}$. For the specific example of leakage, the quantity $\Sigma e^{-\Delta Vti}$, i.e. the sum of the individual leakage currents of the individual memory cells 410-420 is essentially the sum of lognormal values which can be approximated by a lognormal distribution. The distribution of a sum of log-normals has no closed-form expression, but can be reasonably approximated by another log-normal distribution Z at the right tail. The distribution of the sum of log-normals has a probability density function at the neighborhood of 0 that does not resemble any log-normal distribution. A commonly used approximation (due to Fenton and Wilkinson) is obtained by matching the mean and variance of the approximate log-normal distribution as function of $\sigma_z$ and $\mu_z$, characteristics of $\Delta Vt\text{-eqv} \sim N(\mu_z, \sigma_z)$, according to following equations when $\mu_0 = 0$:

$$\sigma_z = \log(\exp(\sigma_0^2 - 1) * 1/m + 1) \quad (1)$$

$$\mu_z = \log(m) + \sigma_0^2/2 - \sigma_z^2/2 \quad (2)$$

Rather than dealing with approximate closed-form equations, the illustrative embodiments propose to match the full distribution function of $\Delta Vt$-eqv (the random variable representative of the equivalent device) to be used in lower-dimensional yield/statistical analysis, and build equivalent distribution in a more flexible open form as opposed to closed form equations. One can then explore the likelihood of matching the resultant equivalent threshold voltage distribution to well-known distributions (as opposed to relying on an approximate leakage current distribution) or may decide to maintain a histogram representation or a tabular representation. Hence, this approach does not rely on any underlying model assumptions, e.g., it is not assumed that the sum of lognormals is a lognormal. Also, the mechanisms of the illustrative embodiments can adapt to any possible distribution and match the different ranges of the distribution as opposed to matching the approximate lognormal mean and standard deviation via closed forms that would end up to match only certain portions of the tails.

In general, in order to obtain the sum of the individual leakage currents, one can randomly sample the value $\Delta Vti$ of the individual memory cells 410-420. Multiple MonteCarlo experiments on the full design can be used to generate samples of $\Delta Vti$. For each sample, the illustrative embodiments can simulate the circuit and obtain the sum of leakage currents $Isum_i$. Hence in association with these samples, the illustrative embodiments can obtain a distribution of the sum of leakage currents. For each sample, by substituting $Isum_i$ and solving for the equivalent $\Delta Vt_{eqv}$ for the wide device, the illustrative embodiments can obtain, for each sample i, an equivalent $\Delta Vt_{eqvi}$ value, and thus, can generate a distribution. This equivalent distribution, $PDF(\Delta Vt_{eqvi})$ is the distribution to be used for the wide device during statistical analysis.

The closed form will not match the whole range of distribution well, however it tries to find an approximate lognormal distribution with matched mean and standard deviation. Thus, it is expected that the closed-form lognormal approximation of the single equivalent wide memory cell 440 should be sufficient at approximating the standard deviation and mean values of the corresponding sums of the samples. However, as shown in FIGS. 5A and 5B, the lognormal approximation for the single equivalent wide memory cell 440 deviates from the samples, with regard to standard deviation $\sigma$ and mean $\mu$ of the underlying independent variable (e.g., threshold voltage), at approximately $\sigma_0 = 1$.

Figure 5A:
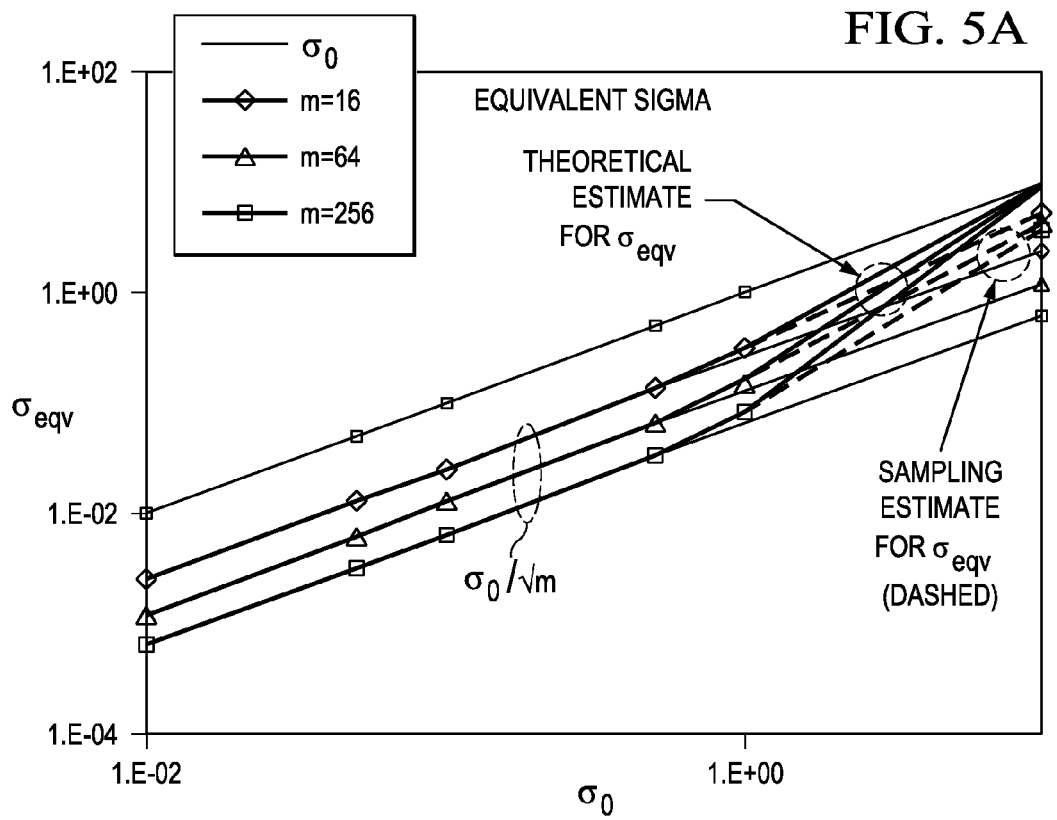
FIG. 5A shows a comparison of the equivalent standard deviation $\sigma_{eqv}$ for a theoretical single equivalent wide memory cell as obtained using a lognormal approximation as discussed above, with an equivalent standard deviation $\sigma_{eqv}$ generated by sampling the individual memory cells themselves.
Figure 5B:
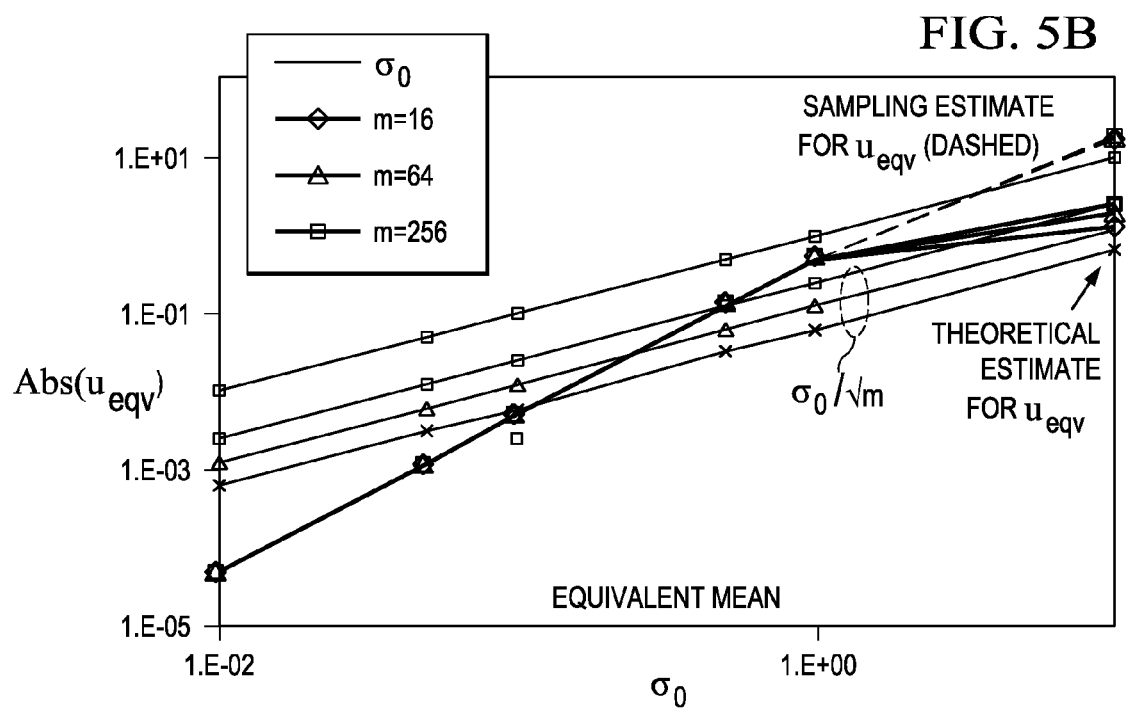
FIG. 5B shows a comparison of the equivalent mean $\mu_{eqv}$ for a theoretical single equivalent wide memory cell as obtained using a lognormal approximation as discussed above, with an equivalent mean $\mu_{eqv}$ generated by sampling the individual memory cells themselves.

FIG. 5A shows a comparison of the equivalent standard deviation $\sigma z_{eqv}$ for a theoretical single equivalent wide memory cell as obtained using a lognormal approximation as discussed above, with an equivalent standard deviation $\sigma_{eqv}$ generated by sampling the individual memory cells themselves and estimating the standard deviations and mean of the $\log(I_{sum})$ in an effort to show the difference of the sampling based behavior (true behavior) used by the illustrative embodiments and the use of an approximation. FIG. 5B shows a comparison of the equivalent mean $\mu z_{eqv}$ for a theoretical single equivalent wide memory cell as obtained using a lognormal approximation as discussed above in equation (2), with an equivalent mean $\mu_{eqv}$ generated by sampling the individual memory cells themselves. These comparisons are performed for a variety of number m of individual memory cells, e.g., 16, 64, and 256 memory cells. As shown in FIGS. 5A and 5B, not only is it the case that the approximate equations do not match the distribution properly, but also the approximate mean and standard deviations ($\sigma_z$, and $\mu_z$) deviate from those of the sampled mean and standard deviation when the variability of the individual devices increases.

Figure 6:
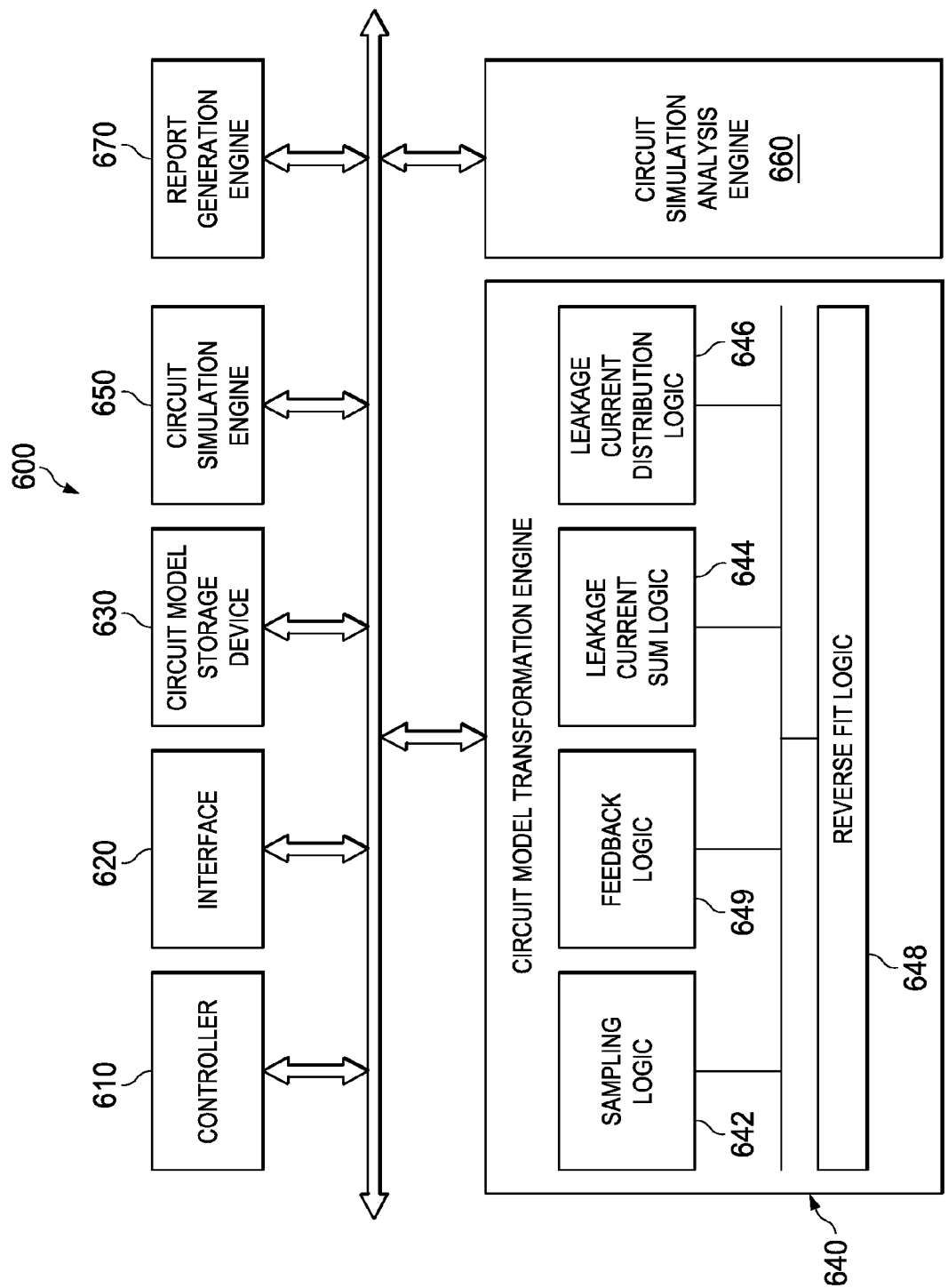
FIG. 6 is an example block diagram of the primary operational elements of a circuit simulation system in accordance with one illustrative embodiment.

FIG. 6 is an example block diagram of the primary operational elements of a circuit simulation system in accordance with one illustrative embodiment. As shown in FIG. 6, the circuit simulation system 600 includes a controller 610, an interface 620, a circuit model storage device 630, a circuit model transformation engine 640, a circuit simulation engine 650, a circuit simulation analysis engine 660, and a report generation engine 670. The elements 610-670 may be implemented in hardware, software, or any combination of hardware and software. In one illustrative embodiment, the elements 610-670 are implemented as software instructions executed by one or more data processing devices, such as one or more processors of the data processing system shown in FIG. 2, or the like.

The controller 610 controls the overall operation of the circuit simulation system 600 and orchestrates the operation of the other elements 620-670. The interface 620 provides a communication interface through which integrated circuit model information may be received from other applications and/or other computing devices. The interface 620 may be a network interface through which integrated circuit model information may be received from one or more client devices and results of simulation may be provided to the one or more client devices. The interface 620 may also be an interface through which user input is received to configure simulations performed by the circuit simulation system 600.

The circuit model storage device 630 stores the integrated circuit model information obtained through the interface 620 for use in performing simulation. This circuit model information may include, for example, one or more netlist data structures specifying the nets of the integrated circuit model, phase and/or periodicity information of clock signals of the integrated circuit model, voltage and current models of the various elements of the integrated circuit model, as well as other information that typically makes up an integrated circuit model, as is generally known in the art.

The circuit model transformation engine 640 operates on the integrated circuit model in the circuit model storage device 630 to identify portions of the integrated circuit model where large numbers of similar devices may be replaced with an equivalent single device. In the examples of the illustrative embodiments described above, the circuit model transformation engine 640 may identify an array of memory devices that may be replaced with a single equivalent wide memory cell that represents all of the memory cells in the array. The circuit model transformation engine 640 operates to gather the necessary samples and calculate the necessary distributions and approximations to facilitate the representation of the many memory cells by a single equivalent wide memory cell. Specifically, the circuit model transformation engine 640 may operate to perform the operation described in greater detail hereafter with regard to FIG. 7 using the various logic elements 642-649 of the circuit model transformation engine.

As shown in FIG. 6, the circuit model transformation engine 640 comprises sampling logic 642, leakage current summation logic 644, leakage current distribution logic 646, reverse fit logic 648, and feedback logic 649. The sampling logic 642, obtains samples of variables for the multiple similar devices and provides these samples to the leakage current summation logic 644. For example, assume that there are 10 devices which are to be represented by a single device. Also assume that a leakage model is built in which 1000 samples are taken. In such a case $X1=[\Delta vt1 \, \Delta vt2 \ldots \Delta Vt10]_1$, would correspond to Isum1 and $X2=[\Delta vt1 \, \Delta vt2, \ldots \Delta vt10]_2$, would correspond to Isum2. Then Isum1 to Isum1000 would be representative of the distribution of the Isum. If the wide device is characterized by $Iwide=f(exp(-\Delta Vtwide))$ then, for each Isum the illustrative embodiments can solve for $(\Delta Vtwide)$ by calculating $(\Delta Vtwide)_1=\log(f^1(Isum_1))$. The distribution of $(\Delta Vtwide_1, \ldots, (\Delta Vtwide_{1000}))$ is the basis for the $\Delta Vteqv$ of the equivalent device.

The leakage current summation logic 644 computes a leakage current sum for the samples and provides this summation to the leakage current distribution logic 646. The leakage current distribution logic 646 computes a distribution of the leakage current summation and provides this distribution to the reverse fit logic 648. The reverse fit logic 648 takes the leakage current values of the leakage current distribution and inserts them into a threshold voltage model of a single equivalent wide memory device so as to fit the leakage current distribution to the voltage model. The result is a threshold voltage distribution that is then used to model the single equivalent wide memory cell device. The results obtained by using this voltage distribution to model the single equivalent wide memory cell device may, in a testing mode, be compared, by the feedback logic 649, to actual results obtained from modeling the individual memory cells individually to provide feedback information for improving the voltage model of the single equivalent wide memory cell so as to more closely approximate the combination of the individual memory cells. To obtain this information, the feedback logic 649 may communicate with the circuit simulation engine 650 and analysis engine 660 to obtain the necessary data to perform the comparisons.

It should be noted that while the illustrative embodiments are described in terms of summing across all of the devices together, the illustrative embodiments are not limited to such. Rather, a more hierarchical approach may be taken in which subsets of the devices are summed to generate a single equivalent wide device and then those single equivalent wide devices may themselves be summed to generate as single equivalent wide device to represent the plurality of other wide devices previously generated. For example, in the case of 1000 devices, a subset of each 25 devices may be used to generate a single equivalent wide device for those 25 devices and then, from the resultant 40 devices, another single equivalent wide device may be built. Such an approach may be used to avoid dealing with large circuit simulation runtimes, i.e. 1000 devices all simulated at the same time, for example.

The circuit simulation engine 650 performs simulation of the integrated circuit model to generate samples for use by the logic of the circuit model transformation engine 640 in transforming the integrated circuit model using a single equivalent wide device to replace multiple similar devices. Moreover, the circuit simulation engine 650 may operate to simulate the resulting transformed circuit model for purposes of testing and analysis, as well as feedback for improving the transformations performed by the circuit model transformation engine 640.

The circuit simulation analysis engine 660 analyzes the results of the circuit simulation in a manner generally known in the art. This analysis may identify problems in the behavior of the integrated circuit model based on specified desired operational behavior, for example, so that notifications may be generated for informing a human designer of areas where the integrated circuit model may need to be modified. The report generation engine 670 may generate such reports for output to user, such as via the interface 620 to a client device, for example. The analysis of simulation results and generation of reports is generally known in the art.

In particular, with regard to the concerns addressed by the present invention, the circuit simulation engine 650 may perform simulations for identifying leakage current affects on the operation of the integrated circuit design. Such leakage current affects may be determined according to the single equivalent wide memory cell that replaces the multiple memory cell elements in the original integrated circuit model, thereby simplifying the simulation and ultimate analysis performed by the circuit simulation analysis engine 660.

FIG. 7 is a flowchart outlining an example operation of a circuit model transformation by replacing large numbers of similar devices with a single equivalent wide device, such as may be performed by the circuit model transformation engine 640 in FIG. 6, for example, in accordance with one illustrative embodiment. As shown in FIG. 7, the operation starts by randomly sampling a variable Vti for multiple devices in a group having a plurality of similar devices (step 710). In the illustrative embodiments, the variable Vti is the threshold voltage of the transistors coupled to the read bit line (RBL) of a memory column with a plurality of unselected memory pass-gate devices. A sum of the leakage currents for the samples of Vti is calculated based on the sampled Vti values (step 720). From the sum of the leakage currents, a distribution of the leakage current summation is generated (step 730). The distribution of the sum of the leakage currents is then reverse fit via a pre-characterized model into a threshold voltage distribution of a single equivalent wide device, e.g., single equivalent wide memory cell (in this case, the equivalent off pass-gate is the critical portion whose distribution is of concern) (step 740). The pre-characterized threshold voltage model of the wide device, as a function of the leakage current, can be constructed by studying the device leakage over a range of threshold voltage variations (from a hardware or spice simulation, for example). The data is then empirically fit into a best-fitting function, e.g., delta_Vt=g(log(I)), or can be built in tables that may be used to interpolate the threshold voltage model.

A corresponding distribution of the threshold voltage of the single equivalent wide device is then used to model the single equivalent wide device in the integrated circuit model, i.e. the multiple devices are replaced with this single equivalent wide device in the integrated circuit model to generate a transformed circuit model (step 750). For example, a statistical analysis tool may replace the plurality of devices in the integrated circuit design by a single equivalent wide device generated by the mechanisms of the illustrative embodiments and may then generate e samples according to the new delta_Vt_eqv of the single equivalent wide device as opposed to the generating many delta_Vt samples for the plurality of the original small devices.

Having generated the single equivalent wide device and used it to model the multiple devices, the operation then terminates. In a further illustrative embodiment, feedback may be used to further tune the voltage model of the single equivalent wide device so that the resulting voltage distribution more closely resembles the actual results obtained from sampling the multiple devices individually.

Contrary to traditional designer's approach in which a wide device distribution is scaled from the individual device distribution by maintaining a 'zero mean' and scales the threshold voltage variation according to width scaling (1/sqrt(W)), the illustrative embodiments incorporates a true statistical matching and not a simple linear combination scaling/mapping of the equivalent distribution. The corrected model generated by the illustrative embodiments finds a true statistical distribution that statistically matches the distribution of the single equivalent wide device leakages to that of the many individual devices that enables capturing the modeled nonlinear functionality well. Furthermore, the corrected model is better than the theoretical model (shown in the FIGS. 5A and 5B) because it targets matching the whole distribution of the underlying independent variable as opposed to assuming an approximate distribution that matches the mean and standard deviation of the functionality by closed form.

Thus, the illustrative embodiments provide mechanisms for modeling multiple similar devices as a single equivalent wide device using a statistical distribution of the operational characteristics of the individual devices as a basis for modeling the single equivalent wide device. In particular, the illustrative embodiments provide such a single equivalent wide device model for purposes of modeling leakage current affects on an integrated circuit device. It should be appreciated that the mechanisms of the illustrative embodiments may be used to improve the design, testing, analysis, and verification process of an integrated circuit design before fabrication of an integrated circuit device. The resulting integrated circuit device may be fabricated from a finalized design that may have been modified from an original integrated circuit design based on the results of modeling the multiple similar elements using a single equivalent wide device in accordance with the mechanisms of the illustrative embodiments.

The method as described above is used in the fabrication of integrated circuit devices or chips. The resulting integrated circuit devices or chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for modeling a plurality of devices of an integrated circuit design as a single statistically equivalent wide device, comprising:
    storing an integrated circuit design in a storage device associated with the data processing system;
    analyzing, by a processor of the data processing system, the integrated circuit design to identify a portion of the integrated circuit design having the plurality of devices;
    generating, by the processor, for the plurality of devices, a statistical model of a single statistically equivalent wide device having a statistical distribution of at least one operating characteristic of the single statistically equivalent wide device that captures statistical operating characteristic distributions of individual devices in the plurality of devices, wherein at least one statistical operating characteristic of the single statistically equivalent wide device is a complex non-linear function of the statistical operating characteristics of the individual devices; and
    modeling, by the data processing system, the integrated circuit design using the single statistically equivalent wide device.

2. The method of claim 1, wherein generating the single statistically equivalent wide device comprises:
- generating, by the processor, samples of random variables associated with the plurality of devices in the identified portion using the integrated circuit design;
- generating, by the processor, a distribution of nonlinear behavior under study based on the samples of random variables; and
- reverse fitting, by the processor, the distribution of nonlinear behavior into a random variable model of the single statistically equivalent wide device to generate a random variable distribution for the single statistically equivalent wide device.

3. The method of claim 2, wherein the nonlinear behavior under study is at least one of bitline leakage current behavior, threshold current behavior, resistance behavior, or capacitance behavior.

4. The method of claim 1, wherein modeling the integrated circuit using the single statistically equivalent wide device comprises replacing the plurality of devices in the identified portion of the integrated circuit design with the single statistically equivalent wide device using an estimated random variable distribution of the single statistically equivalent wide device.

5. The method of claim 1, wherein the plurality of devices are similar devices having non-linear behavior, with regard to at least one characteristic of the devices.

6. The method of claim 1, wherein the portion of the integrated circuit design is a portion of a memory cell array, the plurality of devices are memory cells of an array of memory cells coupled to a bitline of the memory cell array, and wherein the single statistically equivalent wide device is a single statistically equivalent wide memory cell.

7. The method of claim 6, wherein modeling the integrated circuit design using the single statistically equivalent wide device comprises modeling bitline leakage current of the plurality of memory cells in the memory cell array using the single statistically equivalent wide memory cell.

8. The method of claim 1, wherein generating the single statistically equivalent wide device comprises:
- randomly sampling voltages of the plurality of devices to thereby generate multiple samples of voltages for the plurality of devices;
- generating a leakage current summation for each of the samples in the multiple samples;
- generating a distribution of the leakage current summations; and
- reverse fitting the distribution into a threshold voltage model of the single statistically equivalent wide device to generate a distribution of equivalent threshold voltage values for the single statistically equivalent wide device.

9. The method of claim 8, further comprising obtaining feedback information from the modeling of the integrated circuit design and updating the threshold voltage model of the single statistically equivalent wide device based on the feedback information.

10. A computer program product comprising a computer recordable medium having a computer readable program recorded thereon, wherein the computer readable program, when executed on a data processing system, causes the data processing system to:
- analyze an integrated circuit design to identify a portion of the integrated circuit design having the plurality of devices;
- generate, for the plurality of devices, a statistical model of a single statistically equivalent wide device having a statistical distribution of at least one operating characteristic of the single statistically equivalent wide device that captures statistical operating characteristic distributions of individual devices in the plurality of devices, wherein at least one statistical operating characteristic of the single statistically equivalent wide device is a complex non-linear function of the statistical operating characteristics of the individual devices; and
- model the integrated circuit design using the single statistically equivalent wide device.

11. The computer program product of claim 10, wherein the computer readable program causes the data processing system to generate the single statistically equivalent wide device by:
- generating samples of random variables associated with the plurality of devices in the identified portion using the integrated circuit design;
- generating a distribution of nonlinear behavior under study based on the samples of random variables; and
- reverse fitting the distribution of nonlinear behavior into a random variable model of the single statistically equivalent wide device to generate a random variable distribution for the single statistically equivalent wide device.

12. The computer program product of claim 11, wherein the nonlinear behavior under study is at least one of bitline leakage current behavior, threshold current behavior, resistance behavior, or capacitance behavior.

13. The computer program product of claim 10, wherein the computer readable program causes the data processing system to model the integrated circuit using the single statistically equivalent wide device by replacing the plurality of devices in the identified portion of the integrated circuit design with the single statistically equivalent wide device using an estimated random variable distribution of the single statistically equivalent wide device.

14. The computer program product of claim 10, wherein the plurality of devices are similar devices having non-linear behavior, with regard to at least one characteristic of the devices.

15. The computer program product of claim 10, wherein the portion of the integrated circuit design is a portion of a memory cell array, the plurality of devices are memory cells of an array of memory cells coupled to a bitline of the memory cell array, and wherein the single statistically equivalent wide device is a single statistically equivalent wide memory cell.

16. The computer program product of claim 15, wherein the computer readable program causes the data processing system to model the integrated circuit design using the single statistically equivalent wide device by modeling bitline leakage current of the plurality of memory cells in the memory cell array using the single statistically equivalent wide memory cell.

17. The computer program product of claim 10, wherein the computer readable program causes the data processing system to generate the single statistically equivalent wide device by:
- randomly sampling voltages of the plurality of devices to thereby generate multiple samples of voltages for the plurality of devices;
- generating a leakage current summation for each of the samples in the multiple samples;
- generating a distribution of the leakage current summations; and
- reverse fitting the distribution into a threshold voltage model of the single statistically equivalent wide device to generate a distribution of equivalent threshold voltage values for the single statistically equivalent wide device.

18. The computer program product of claim 17, wherein the computer readable program further causes the data processing system to obtain feedback information from the modeling of the integrated circuit design and update the threshold voltage model of the single statistically equivalent wide device based on the feedback information.

19. An apparatus, comprising:
a processor; and
a memory coupled to the processor, wherein the memory comprises instructions which, when executed by the processor, cause the processor to:
analyze an integrated circuit design to identify a portion of the integrated circuit design having the plurality of devices;
generate, for the plurality of devices, a statistical model of a single statistically equivalent wide device having a statistical distribution of at least one operating characteristic of the single statistically equivalent wide device that captures statistical operating characteristic distributions of individual devices in the plurality of devices, wherein at least one statistical operating characteristic of the single statistically equivalent wide device is a complex non-linear function of the statistical operating characteristics of the individual devices; and
model the integrated circuit design using the single statistically equivalent wide device.

20. The apparatus of claim 19, wherein the processor generates the single statistically equivalent wide device by:
generating samples of random variables associated with the plurality of devices in the identified portion using the integrated circuit design;
generating a distribution of nonlinear behavior under study based on the samples of random variables; and
reverse fitting the distribution of nonlinear behavior into a random variable model of the single statistically equivalent wide device to generate a random variable distribution for the single statistically equivalent wide device.

21. The method of claim 1, wherein the portion of the integrated circuit design is less than a whole of the integrated circuit design.

22. The computer program product of claim 10, wherein the portion of the integrated circuit design is less than a whole of the integrated circuit design.

23. The method of claim 1, wherein modeling the integrated circuit using the single statistically equivalent wide device comprises:
replacing the plurality of devices in the identified portion of the integrated circuit design with the single statistically equivalent wide device to generate a modified portion of the integrated circuit design; and
modeling at least the modified portion of the integrated circuit design including the single statistically equivalent device.

24. The computer program product of claim 10, wherein the computer readable program causes the data processing system to model the integrated circuit using the single statistically equivalent wide device at least by:
replacing the plurality of devices in the identified portion of the integrated circuit design with the single statistically equivalent wide device to generate a modified portion of the integrated circuit design; and
modeling at least the modified portion of the integrated circuit design including the single statistically equivalent device.

25. The apparatus of claim 19, wherein the instructions cause the processor to model the integrated circuit using the single statistically equivalent wide device at least by:
replacing the plurality of devices in the identified portion of the integrated circuit design with the single statistically equivalent wide device to generate a modified portion of the integrated circuit design; and
modeling at least the modified portion of the integrated circuit design including the single statistically equivalent device.

* * * * *